US012382182B2

United States Patent
Brunk et al.

(10) Patent No.: US 12,382,182 B2
(45) Date of Patent: Aug. 5, 2025

(54) LIGHTING ARRANGEMENTS FOR MATERIAL SORTING

(71) Applicant: Digimarc Corporation, Beaverton, OR (US)

(72) Inventors: Hugh L. Brunk, Portland, OR (US); John D. Lord, West Linn, OR (US); Tomas Filler, Beaverton, OR (US)

(73) Assignee: Digimarc Corporation, Beaverton, OR (US)

( * ) Notice: Subject to any disclaimer, the term of this patent is extended or adjusted under 35 U.S.C. 154(b) by 771 days.

(21) Appl. No.: 17/521,697

(22) Filed: Nov. 8, 2021

(65) Prior Publication Data
US 2022/0141373 A1    May 5, 2022

Related U.S. Application Data

(63) Continuation-in-part of application No. 17/470,674, filed on Sep. 9, 2021, now Pat. No. 11,878,327, and
(Continued)

(51) Int. Cl.
*H04N 23/74* (2023.01)
*G06T 7/00* (2017.01)
(Continued)

(52) U.S. Cl.
CPC ........... *H04N 23/74* (2023.01); *G06T 7/0004* (2013.01); *H04N 23/56* (2023.01); *H05B 45/10* (2020.01);
(Continued)

(58) Field of Classification Search
CPC ...... H05B 45/00; H05B 45/10; H05K 7/2039; G06T 7/0004; H04N 23/56; H04N 23/74
See application file for complete search history.

(56) References Cited

U.S. PATENT DOCUMENTS

| 5,314,072 A | 5/1994 | Frankel |
| 6,882,738 B2 | 4/2005 | Davis |

(Continued)

FOREIGN PATENT DOCUMENTS

| CA | 2959395 A1 * | 9/2017 | ............ B01J 19/123 |
| EP | 3165860 A1 * | 5/2017 | .............. F26B 15/18 |

(Continued)

OTHER PUBLICATIONS

Optimizing PCB Thermal Performance for Cree XLmp LEDs, Cree Product Design Guide, Feb. 14, 2019.
(Continued)

*Primary Examiner* — Terrell H Matthews
(74) *Attorney, Agent, or Firm* — Klarquist Sparkman, LLP

(57) ABSTRACT

In one aspect, an elongated lighting module includes plural colors of LEDs that flash in a cyclical sequence to provide multi-spectral illumination. Several such modules can be arranged end-to-end to span a conveyor system that transports a stream of plastic waste items in a recycling center, enabling capture of differently-illuminated image frames depicting the items. Each module may include N LEDs of a first color (e.g., red) and M LEDs of a second color (e.g., blue), where N and M are different. Drive circuitry can be simplified by configuring the LEDs in strings of common colors, but with different counts. Electrical noise due to switching transients can be reduced by operating the LEDs at a low current when not being flashed. A great variety of other features and arrangements are also detailed.

10 Claims, 8 Drawing Sheets

Related U.S. Application Data a continuation-in-part of application No. 17/214,455, filed on Mar. 26, 2021, now Pat. No. 11,741,733, said application No. 17/470,674 is a continuation of application No. PCT/US2020/022801, filed on Mar. 13, 2020, which is a continuation-in-part of application No. 16/435,292, filed on Jun. 7, 2019, now abandoned.

(60) Provisional application No. 63/146,631, filed on Feb. 6, 2021, provisional application No. 63/117,828, filed on Nov. 24, 2020, provisional application No. 63/110,923, filed on Nov. 6, 2020, provisional application No. 63/093,207, filed on Oct. 17, 2020, provisional application No. 63/011,195, filed on Apr. 16, 2020, provisional application No. 63/000,471, filed on Mar. 26, 2020, provisional application No. 62/968,106, filed on Jan. 30, 2020, provisional application No. 62/967,557, filed on Jan. 29, 2020, provisional application No. 62/956,493, filed on Jan. 2, 2020, provisional application No. 62/923,274, filed on Oct. 18, 2019, provisional application No. 62/854,754, filed on May 30, 2019, provisional application No. 62/845,230, filed on May 8, 2019, provisional application No. 62/836,326, filed on Apr. 19, 2019, provisional application No. 62/830,318, filed on Apr. 5, 2019, provisional application No. 62/818,051, filed on Mar. 13, 2019.

(51) Int. Cl.
*H04N 23/56* (2023.01)
*H05B 45/10* (2020.01)
*H05K 7/20* (2006.01)

(52) U.S. Cl.
CPC .. *H05K 7/2039* (2013.01); *G06T 2207/30108* (2013.01)

(56) References Cited

U.S. PATENT DOCUMENTS

| | | | |
|---|---|---|---|
| 8,134,132 B2* | 3/2012 | Middlemass | G02B 6/0006 362/558 |
| 2007/0153277 A1* | 7/2007 | Shakespeare | G01J 3/501 356/402 |
| 2007/0295814 A1 | 12/2007 | Tanaka | |
| 2011/0161076 A1 | 6/2011 | Davis | |
| 2011/0212717 A1 | 9/2011 | Rhoads | |
| 2011/0240739 A1 | 10/2011 | Delaigle | |
| 2012/0067959 A1 | 3/2012 | Rowe | |
| 2012/0126698 A1* | 5/2012 | De Oto | H02J 7/345 315/121 |
| 2012/0194082 A1* | 8/2012 | Huang | H05B 45/20 315/297 |
| 2014/0057676 A1 | 2/2014 | Lord | |
| 2014/0210967 A1 | 7/2014 | Kirkerud | |
| 2016/0077020 A1 | 3/2016 | Leconte | |
| 2017/0006693 A1* | 1/2017 | Raposo | H05B 47/19 |
| 2018/0001352 A1 | 1/2018 | Huber | |
| 2018/0039805 A1 | 2/2018 | Boles | |
| 2018/0345323 A1 | 12/2018 | Kerver | |
| 2019/0306385 A1 | 10/2019 | Sharma | |
| 2020/0051059 A1 | 2/2020 | Filler | |
| 2021/0299706 A1 | 9/2021 | Filler | |
| 2021/0394077 A1* | 12/2021 | Wang | A47D 15/001 |

FOREIGN PATENT DOCUMENTS

| | | | |
|---|---|---|---|
| EP | 3213826 A2 * | 9/2017 | B01J 19/123 |
| WO | 2020186234 | 9/2020 | |
| WO | 2021078842 | 4/2021 | |

OTHER PUBLICATIONS

Strip lens drawing, Khatod, 2013.
Symmetric & Asymmetric Strip Lens, Khatod Technical Department Product Technical Brief, 2013.

* cited by examiner

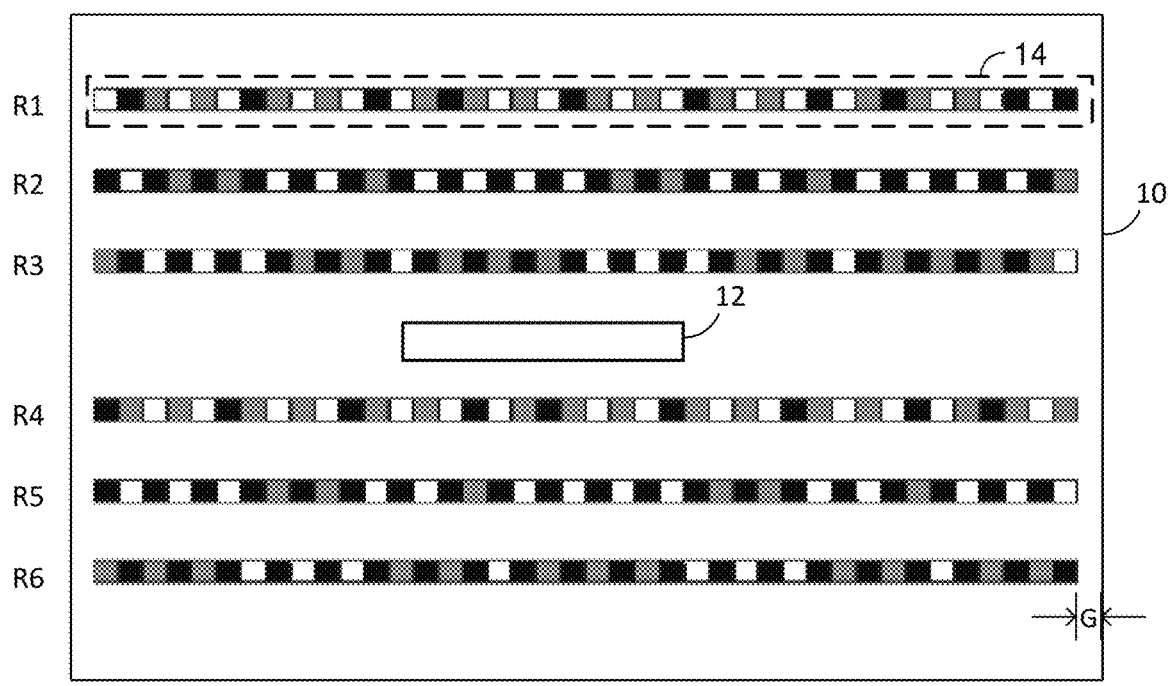
FIG. 1
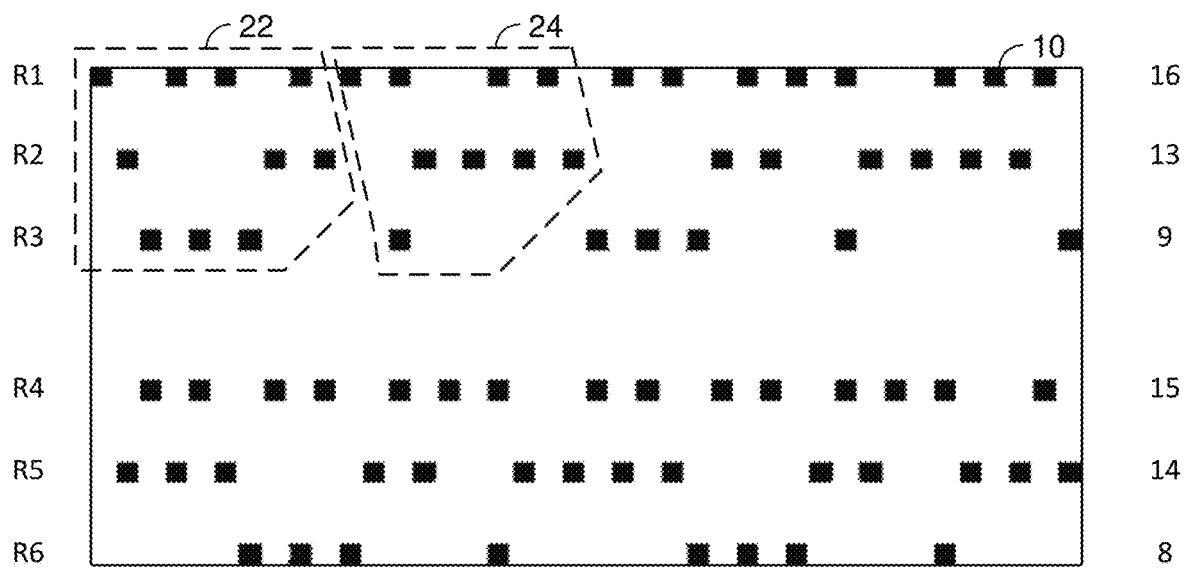
FIG. 2A  BLUE LED MAP

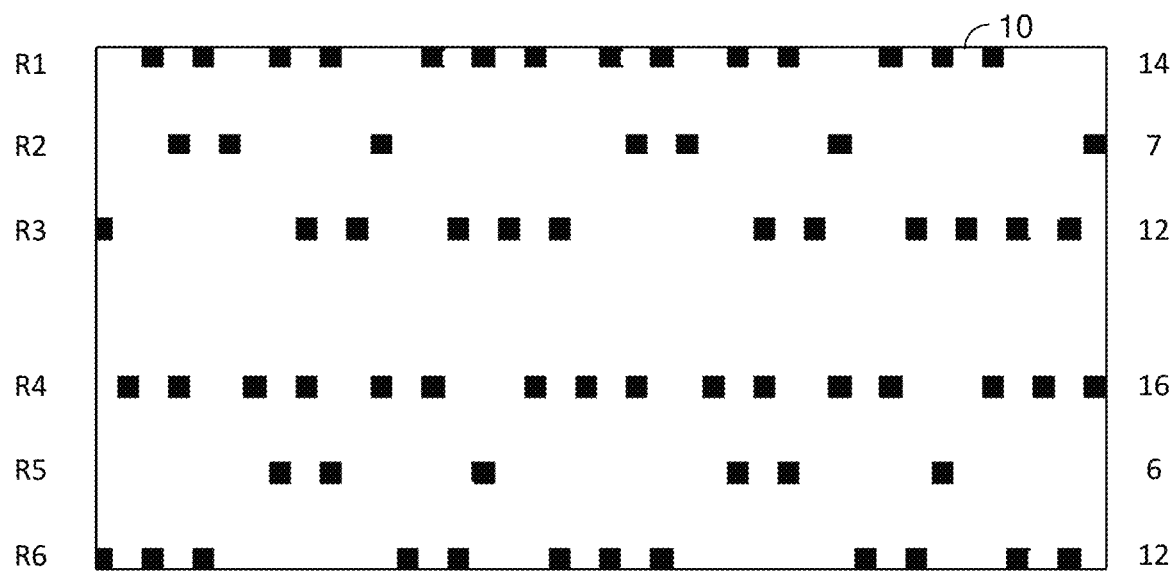
FIG. 2B    RED LED MAP
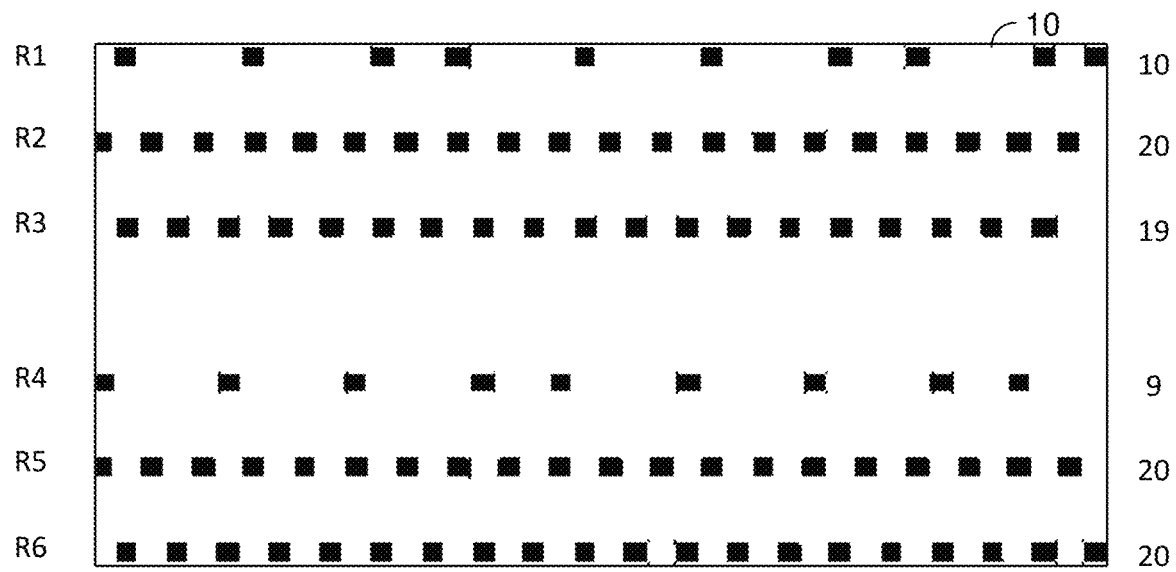
FIG. 2C    INFRARED LED MAP

LIGHTING ARRANGEMENTS FOR MATERIAL SORTING

RELATED APPLICATION DATA

This application claims priority to provisional patent applications 63/117,828, filed Nov. 24, 2020, and 63/110,923, filed Nov. 6, 2020. This application is also a continuation-in-part of application Ser. No. 17/470,674, filed Sep. 9, 2021, which is a continuation of application PCT/US20/22801, filed Mar. 13, 2020 (now U.S. Pat. No. 11,878,327), which is a continuation-in-part of patent application Ser. No. 16/435,292, filed Jun. 7, 2019 (published as US20190306385) (now abandoned). PCT/US20/22801 also claims priority to the following provisional patent applications: 62/968,106, filed Jan. 30, 2020; 62/967,557, filed Jan. 29, 2020; 62/956,493, filed Jan. 2, 2020; 62/923,274, filed Oct. 18, 2019; 62/854,754, filed May 30, 2019; 62/845,230, filed May 8, 2019; 62/836,326, filed Apr. 19, 2019; 62/830,318, filed Apr. 5, 2019; and 62/818,051, filed Mar. 13, 2019. This application is also a continuation-in-part of application Ser. No. 17/214,455, filed Mar. 26, 2021 (now U.S. Pat. No. 11,741,733), which claims priority from provisional applications 63/146,631, filed Feb. 6, 2021, 63/093,207, filed Oct. 17, 2020, 63/011,195, filed Apr. 16, 2020, and 63/000,471, filed Mar. 26, 2020. The foregoing applications are incorporated herein by reference.

TECHNICAL FIELD

The present technology concerns a flash lighting assembly, e.g., as may be used to illuminate image frame captures in a waste sorting system.

BACKGROUND AND INTRODUCTION TO THE TECHNOLOGY

Applicant is involved in the automated sorting of plastic bottles and other items for recycling, based on code (e.g., digital watermark) markings printed on item labels, or formed as 3D surface textures on item substrates. Such work is detailed in applicant's previous patent filings, including published applications US20190306385 and US20210299706, and pending U.S. application Ser. No. 16/944,136, filed Jul. 30, 2020, 63/257,306, filed Oct. 19, 2021, and 63/240,821, filed Sep. 3, 2021. These documents are incorporated herein by reference, as they form a foundation on which the present specification builds.

As disclosed in the cited documents, reliable reading of the codes is aided by rapid capture of many short exposure, high resolution frames of imagery—commonly more than 200 per second, and sometimes more than 300 per second—due to the high speed at which material moves on the conveyor belts in recycling facilities (commonly three or five meters per second), and the distance from which the codes must be discerned (e.g., 40 or 50 cm or more).

Applicant has found that code reading works best, from the diversity of item types found in common material flows, when images are captured under different lighting conditions. For expository convenience, this document focuses its description on illustrative embodiments in which a monochrome camera system captures a first frame under blue light (e.g., a peak wavelength between 440 and 495 nm), and an instant later captures a second frame under red light (e.g., a peak wavelength between 620 and 699 nm), and a further instant later captures a third frame under infrared light (e.g., a peak wavelength between 700 and 790 nm). However, none of these parameters is essential to the present technology; more or fewer colors can be used, and the colors can be of different wavelengths.

The just-noted exemplary cycle recurs continuously, sometimes a hundred or more times a second, as items move under the camera on a conveyor belt. Each frame is analyzed to decode any code on a depicted item, and the item is then sorted in accordance with the code (e.g., routing PET bottles and food containers to one repository, PET non-food items to another repository, and PVC items to still another repository, etc.).

Applicant favors light emitting diodes (LEDs) for generating the different colors of light, due to their modest costs and their long lifetimes. However, practical considerations pose difficulties.

Due to the significant width of the conveyor belt (which may measure a meter or more across), and the need to provide generally uniform illumination, an elongated light source that spans the belt is commonly employed. (The light source may thus be termed a light bar, with the lengthwise dimension oriented across the belt, and the short dimension being oriented parallel to the direction of belt travel.)

Because the camera exposure interval is so short (typically well less than a thousandth of a second, and often 100 microseconds or less, e.g., 30-80 microseconds, in order to freeze movement on the fast-moving belt), adequate illumination of each image frame requires a very high instantaneous light output. High output can be achieved through use of a sufficiently-large number of LEDs, but as more LEDs are used, the width of the light bar—in the direction of belt travel—grows. Reading codes that are formed as 3D surface textures on plastic items may sometimes rely on shadowing caused by the surface elevations and depressions. (It can also rely on specular reflections, as well as diffuse reflections.) To increase the sharpness of shadows, it can be desirable to use a light bar that is as physically-narrow as possible. (By way of analogy, the sun casts well-defined shadows; the diffuse illumination of an overcast day does not.) But crowding of the LED components increases heating of the light assembly, shortening its service life.

One approach is to organize the light bar as three rows of LEDs spanning its length across the belt: one row infrared, one row red, and one row blue, each operated in turn. Applicant discovered this arrangement to be disadvantageous. The direction of illumination changes depending on which row of LEDs is illuminated. This causes shadows and specular reflections on items in the focal zone to shift and have slightly different presentations, frame-to-frame, even if the belt is stationary. To optimize detection it can be helpful not to have the shadows and specular reflections dance about in such a frame-to-frame manner.

Still another issue involves the different electrical characteristics of the differently-colored LEDs. To achieve a given level of irradiance (as sensed by the greyscale output from the camera), the three colors of LEDs each requires a different driving current. This complicates circuit design, which in turn decreases reliability.

Yet another issue involves the weak signals collected by the camera sensor, due to the short exposure intervals and the high resolution of the imagery (which requires physically small photosensors). In these weak signal conditions, ambient noise that is induced in the circuitry and signal wiring can impair the imagery, increasing image noise, and decreasing code detection. Industrial sorting equipment is inherently noisy due to the large motors and other electrical equipment involved. But another significant contributor to ambient noise is the switching transients that arise when banks of high current LEDs are switched on and off in the lighting bar, which is necessarily positioned in close physical proximity to the camera.

Aspects of the present technology address these and other problems associated with lighting systems for industrial sorting facilities.

BRIEF DESCRIPTION OF THE DRAWINGS

FIG. 1 shows the placement of 240 LEDs, in 6 rows of 40 LEDs, in an exemplary LED module.

FIG. 2A shows where blue LEDs are placed among the 240 LEDs in FIG. 1.

FIG. 2B shows where red LEDs are placed among the 240 LEDs in FIG. 1.

FIG. 2C shows where infrared LEDs are placed among the 240 LEDs in FIG. 1.

DETAILED DESCRIPTION

Figure 3:
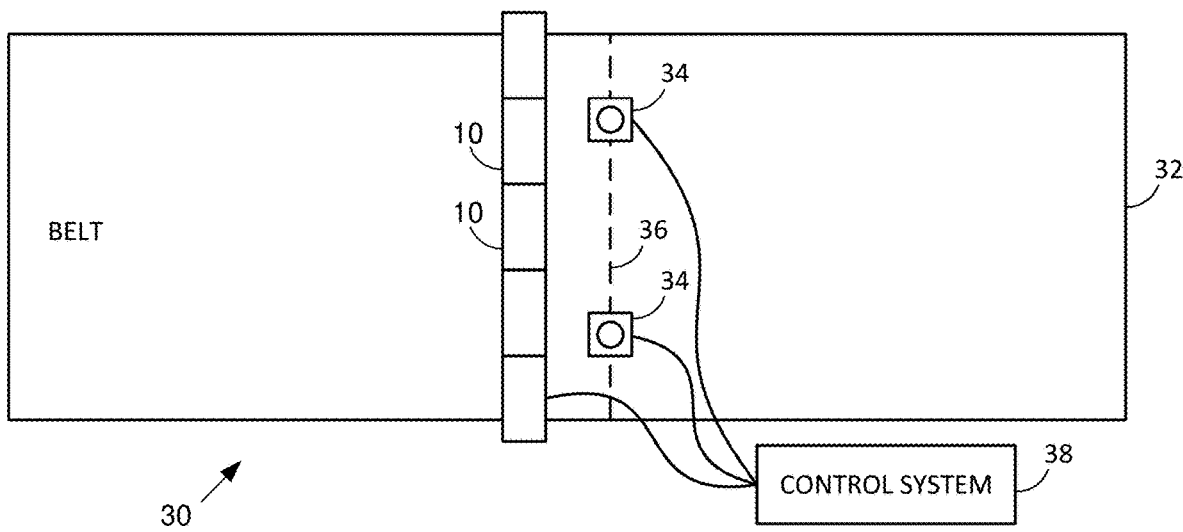
FIG. 3 shows a top schematic view of part of an exemplary recycling system, employing a light bar including plural LED modules, and plural cameras.

An illustrative embodiment employing aspects of the present technology is a light bar that comprises several modules, arrayed end-to-end. Each module is a circuit board 10, e.g., measuring 20×12 cm, shown in FIG. 1. On the board are mounted six rows of LEDs, as labeled at the left. Each row includes multiple colors of LEDs—40 LEDs in all. A connector 12 near the middle of the board couples the module to a power supply circuit board (not shown).

In a particular example, the LEDs used are Cree part numbers XPEBRY-L1-0000-00R02 (blue), XPEBPR-L1-0000-00D01 (red), and XPEBFR-L1-0000-00901 (infrared). These devices are rated for operation at one ampere of driving current, but here are operated with a drive current of three amps. This is permissible given the short duty cycles involved.

To deal with the different electrical characteristics of these different LEDs, and make the drive electronics more consistent, applicant provides different numbers of LEDs of the different colors on the circuit board 10. There are fewer of the brighter LEDs (the red LEDs), and more of the less-bright LEDs (the blue and infrared LEDs). By such arrangement, the module produces roughly equal irradiance of all different colors by applying the same current to each LED, despite the varying irradiance (light output) of the differently-colored LEDs at a given current.

In a particular embodiment there are 67 red LEDs, 75 blue LEDs and 98 infrared LEDs. All the LEDs are driven by the same current. But the blue LEDs of the light assembly provide roughly equal irradiance as the red LEDs, despite there being 12% more blue LEDs than red LEDs. ("Roughly equal" is in contrast to proportional. That is, proportionality would indicate that a 12% greater number of blue LEDs would produce an increase in irradiance of 12%. Roughly equal, in contrast, means the increase in irradiance is closer to zero than to 12%. So the roughly equal irradiance from the larger number of blue LEDs is not more than 106% of the irradiance from the red LEDs.)

FIG. 2A shows the locations of the blue LEDs on circuit board 10. On the right are counts of the blue LEDs in each spatial grouping (row). For example, the first row has 16 blue LEDs, the second row has 13 blue LEDs, the third row has 9 blue LEDs, etc.

FIG. 2B shows the locations of the red LEDs on circuit board 10. The first row has 14, the second row has 7, the third row has 12, etc.

FIG. 2C shows the locations of the infrared LEDs on the circuit board. The first row has 10, the second row has 20, the third row has 19, etc.

The arrangement of LEDs of different colors on circuit board 10 is somewhat arbitrary, but with the goal of achieving a degree of uniformity for each color across the expanse of the board—a task made somewhat challenging by the 75/67/98 counts involved.

If the counts of blue, red, and infrared LEDs in the first row of the circuit board 10 are denoted X1, Y1 and Z1, respectively, and the counts of blue, red and infrared LEDs in the second row are similarly denoted X2, Y2 and Z2, it will be seen that X1 and X2 are different (i.e., 16 vs. 13). Likewise, Y1 and Y2 are different (14 vs. 7), as are Z1 and Z2 (10 vs. 20).

Each of the six rows of LEDs on the circuit board may be regarded as a spatial grouping. More generally, each spatial grouping defines a set of LEDs that falls within a rectangular border, such as the border 14 of FIG. 1.

Additionally, the LEDs are organized in electrical groupings. Each electrical grouping comprises a series string of same-colored LEDs that are powered together. As detailed below, a power source provides 48 volts to each string, and includes a current regulator to set the LED string current to 3 amps. Different colors of LEDs have different typical forward voltage drops, so different numbers of LEDs can be included in a string, depending on color. In the exemplary arrangement, nine or ten blue LEDs can be operated in a common string from a 48 volt supply; twelve or thirteen red LEDs can be operated in a common string; and twelve or thirteen infrared LEDs can be operated in a common string. In such arrangement eight strings are employed to operate the 75 blue LEDs; six strings are employed to operate the 67 red LEDs; and eight strings are employed to operate the 98 infrared LED strings, or 22 strings in all.

In the exemplary arrangement, all of the blue LEDs on circuit board 10 are operated in tandem. Similarly with all the red LEDs and likewise with all the infrared LEDs. Which same-color LEDs are strung together in a common electrical grouping is a matter of convenience, based on ease of circuit board routing. In another arrangement, the blue LEDs on the top half of the board can be controlled independently of the blue LEDs on the bottom half of the board. Similarly for the other colors.

The left-most dashed outline in FIG. 2A shows one electrical grouping 22 of ten blue LEDs—wired together by circuit board traces in series. The adjoining dashed outline shows a second electrical grouping 24, of nine blue LEDs, strung in series. All of the blue LEDs in FIG. 2A are similarly assigned to an electrical grouping of nine or ten LEDs. The red and infrared LEDs of FIGS. 2B and 2C are likewise assigned to electrical groupings, but in those cases the groupings comprise strings of twelve or thirteen LEDs. The circuit board 10 includes multiple layers of traces to facilitate such wiring of the electrical groupings.

Note that the spatial groupings and the electrical groupings are different. The first spatial grouping, i.e., Row 1 in FIG. 1, includes blue LEDs in plural different electrical groupings. Row 1 may likewise include red LEDs in plural different electrical groupings and infrared LEDs in still other plural different electrical groupings. Similarly for the other spatial groupings.

Reciprocally, the first electrical grouping 22 includes blue LEDs in plural different spatial groupings (i.e., rows 1, 2 and 3). Likewise with the second electrical grouping 24.

FIG. 3 is a schematic top-down view of an exemplary recycling system 30. A conveyor belt 32, which may be 0.9 meters in width, transports items beneath plural cameras 34. Although just two cameras are shown for clarity of illustration, there may be any number. In a particular embodiment there are six, with each camera capturing a field of view that spans an area of about 18 cm (across the width of the belt) by about 14 cm (along the long axis of the belt), directly beneath the camera. This forms an aggregate viewing zone that is 14 cm across, centered on the dashed line 36, and spanning the width of the belt (with a bit of image overlap between adjoining cameras). Five light modules 10 form a light bar that is spaced to the side of the cameras (e.g., 5-50 cm away) and illuminates the viewing zone obliquely, helping form shadows on 3D textured item surfaces viewed by the cameras.

The cameras and light bar are coupled to a control system 38. The control system issues signals that cause the light bar to flash its different colors in synchrony with successive frame captures by the cameras. The control system also processes the imagery captured by the cameras, decoding information from detected codes, and issuing signals to diverter equipment (not shown) that effects routing of different items to different destinations in accordance with the detected codes.

Figure 4:
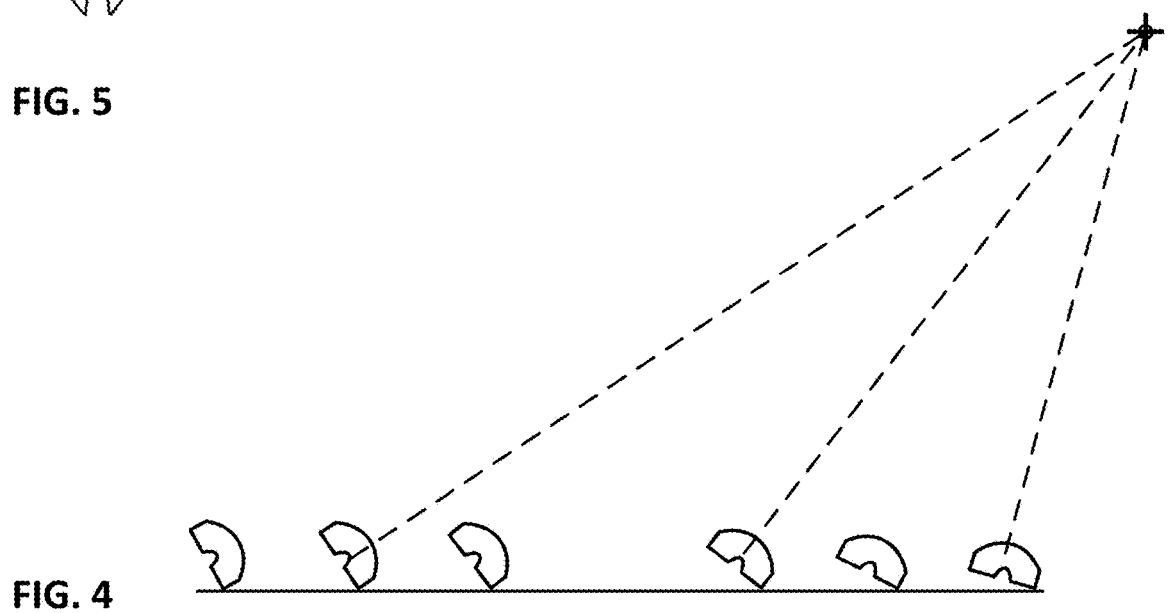
FIG. 4 shows how linear lenses, atop rows of LEDs, can be canted so each directs maximum illumination towards a common viewing zone.

To increase the illumination of the viewing zone, each row of LEDs in each viewing module can be topped with a linear plastic lens, which concentrates emitted light into a focal zone. In a preferred embodiment, a single lens spans all 40 LEDs in a row, although in other embodiments several lenses could be used. To steer all lenses to the camera viewing zone, despite the rows' different spatial locations, the lenses can be differently-canted. This is shown in exaggerated form in FIG. 4. (The canting is usually slight, since the LED rows span a maximum distance of about 10 cm in the illustrated embodiment, whereas the distance between the lighting module and the viewing zone is typically 40 cm or more.) Canting can be achieved by a 3D-printed plastic mount that tilts each lens by a different amount. Alternatively, custom-designed lenses can be fashioned to similar effect.

Figure 5:
FIG. 5 shows the cross-section of a linear lens.

A suitable linear lens is the Khatod PL1629NAST, which has a cross-section as shown in FIG. 5.

The above-identified LEDs each has a footprint measuring 3.5 mm on a side, with about half the bottom surface area comprising a thermal pad. The thermal pad is a region that is thermally coupled to the diode junction, but is electrically isolated from its anode and cathode. Cree recommends that the pad be coupled to a copper region on the printed circuit board immediately-beneath, and that it be thermally coupled to a copper region on the opposite (bottom) side of the board using thermal vias, e.g., 15 plated-through holes, each a fraction of a millimeter in diameter.

Cree indicates the region on the bottom side of the board should be between 3.3 and 20 mm across, and isolated from other regions. However, to achieve the dense packing of LEDs shown in FIG. 1, applicant has found it advantageous to disregard the isolation, and instead employ plated-through vias to a shared ground plane that extends below multiple rows of LEDs on the bottom of the board. Such ground plane comprises copper at a thickness corresponding to two ounces per square foot. Desirably, a majority of the surface area of the bottom of the 20×12 cm circuit board is dedicated to this heat sink capacity, with the fraction exceeding 75% or even 90% in preferred embodiments. In a particularly preferred embodiment, no circuit traces are run on this bottom surface.

In an exemplary embodiment the two long sides of each LED circuit board 10 are mounted to first and second aluminum members, respectively, that extend across the conveyor belt using T-slot structural framing (sometimes termed 80/20 aluminum extrusions). This mounting arrangement thermally-couples both long edges of the bottom of the circuit board to an aluminum structure, providing further thermal dissipation of heat from the LEDs.

Desirably, the placement of LEDs extends nearly to the ends of the circuit board, to minimize gaps in the illumination pattern that may interfere, e.g., with decoding of 2D codes, or recognition of items by image analysis. In FIG. 1, the gap G between the edge of the circuit board and a proximate LED is typically less than three times the width of an individual LED (i.e., a total of 1.05 cm in the depicted embodiment), and preferably is less than two or even one times the width of an individual LED (i.e., 7 mm or 3.5 mm).

Figure 6:
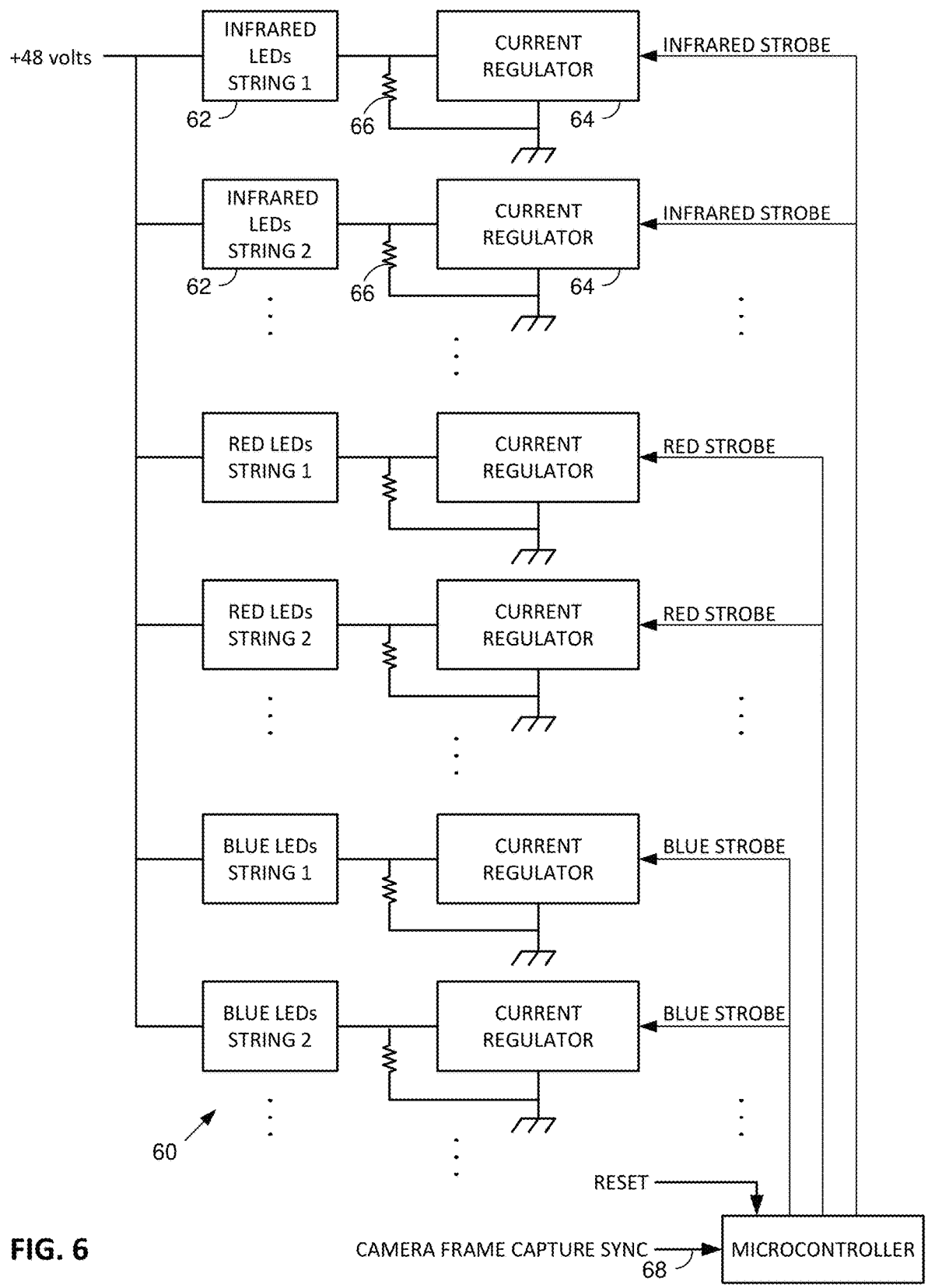
FIG. 6 details circuitry for driving the different strings of LEDs in an exemplary embodiment.

FIG. 6 details the circuitry 60 that drives the different LED strings. Such circuitry is provided on the power supply circuit board that plugs into connector 12 of LED module 10. For sake of clarity, circuitry for only six LED strings is shown, although there are 22 LED strings in the exemplary embodiment.

Each string is indicated by a box 62 on the left. Each string is connected, on one end, to a 48 volt power source, and on the opposite end to a current regulator circuit 64. The current regulator circuit 64 passes 3 amps of current from the 48 volt source, through the LED string, and ultimately to ground, whenever a strobe signal (shown on the right) is brought to a logic low level.

The current regulator primarily comprises an op amp, a transistor, and a quarter ohm current sensing resistor between the transistor emitter and ground. Current from the LED string passes through the collector-emitter path of the transistor, and to ground through the current sensing resistor. A first of the two op amp inputs is connected across this current sensing resistor. The second op amp input is connected to a resistive voltage divider that produces a reference voltage of 0.75 v from a regulated 5 v (or 4.3 v) source. The output of the op amp is connected to the base of the transistor, and applies a control voltage that sets the current flow through the transistor.

If the voltage drop across the current sensing resistor exceeds the reference voltage (i.e., the string current is too high), the op amp output reduces the control voltage applied to the base terminal of the transistor, causing it to reduce current flow through the transistor until the current reaches 3 amps. Conversely, if the voltage drop across the current sensing resistor is below the reference voltage (i.e., the string current is too low), the op amp output increases the control voltage applied to the base terminal of the transistor, causing it to increase current flow through the transistor until the current reaches 3 amps.

A capacitor couples the output of the op amp back to the inverting input to provide negative feedback, reducing the op amp's open loop gain. The strobe signal is applied to an Enable input of the op amp, switching it into operation. A pull-down resistor on the output of the op amp assures it fully turns the transistor off when the strobe signal is not present. In addition to the current sensing resistor, each series string of LEDs includes a small resistor (on the order of a few ohms) that can drop excess voltage if the forward voltage drops across the LEDs is towards the lower end of specifications (or if, e.g., in a blue string, nine LEDs instead of ten are used). This resistor can be shunted by a wire such a voltage drop is not needed.

To reduce camera noise due to LED switching transients, a resistor 66 is provided across each current regulator to draw a trickle current through the LED string when the current source is switched off (i.e., when no strobe signal is present). This current—typically tens or a hundred microamps—is small enough to only dimly illuminate the LEDs, providing illumination that is 10% or less (or much less) of the LEDs' illumination when driven with a 3 amp current. Yet such small trickle current provides a voltage drop across this resistor of 10 or more volts (in some embodiments up to about 25 volts). Thus, instead of switching a 48 volt signal on and off, the transistor of the current regulator switches a signal of 10 volts (or 25 volts). Switching transients, and resultant electromagnetic interference to the camera imagery, are reduced commensurately.

Shown at the bottom of FIG. 6 is a microcontroller that applies strobe signals to the blue, red and infrared LED current sources in synchrony with frame captures of the cameras, as signaled on a line 68 from the control system 38. A reset input can be activated by the control system 38 to force the microcontroller to a known state, e.g., so that the next signal on line 68 will cause the blue LEDs to flash next. Suitable microcontrollers include the ATmega 328*p*, 2560 and 1281 devices.

Alternative Arrangement

Figure 7:
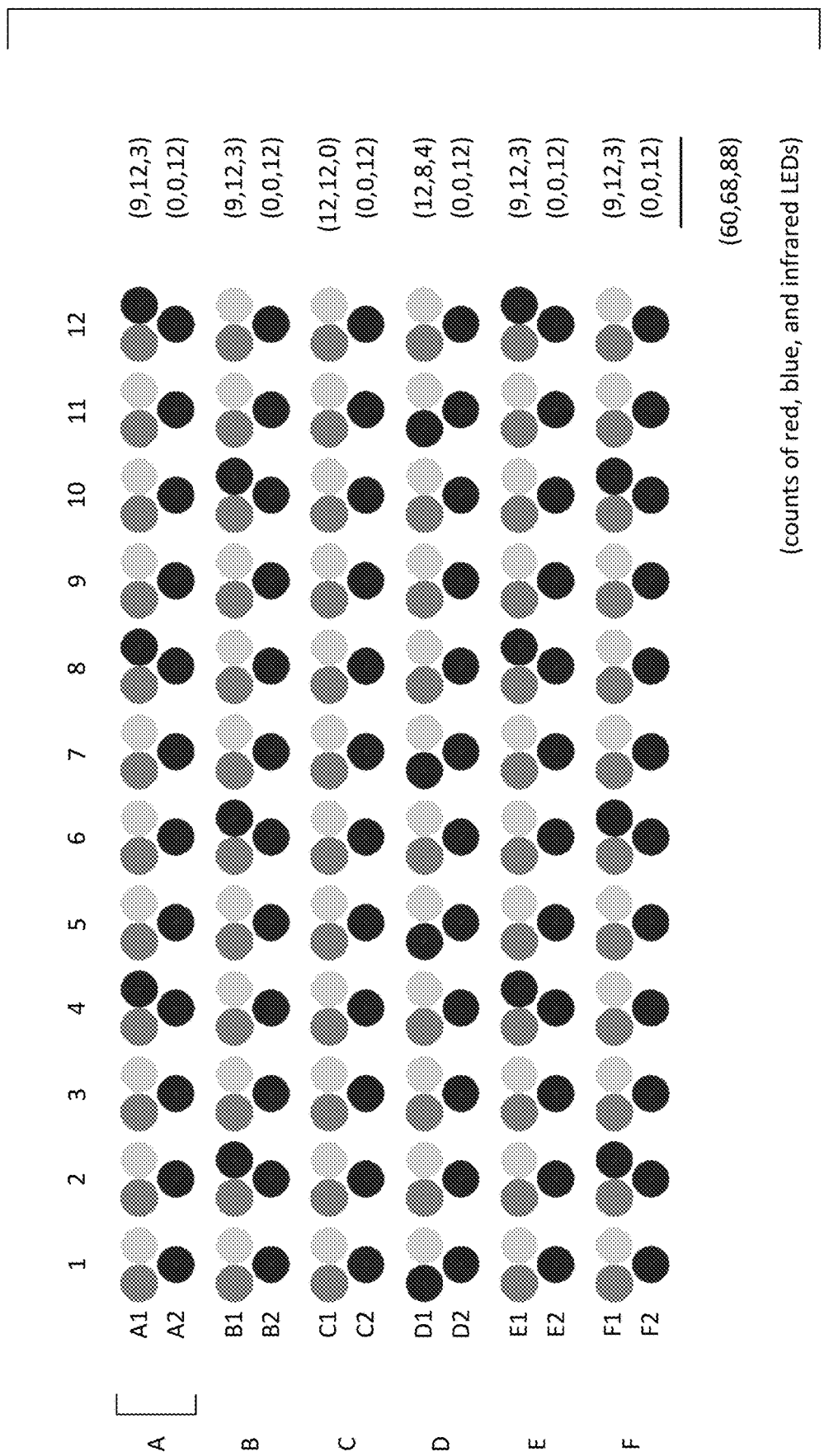
FIG. 7 shows an alternative arrangement for placement of 216 LEDs.

FIG. 7 shows an alternative illumination module, which may be regarded as an improvement over the arrangement of FIG. 25 in our patent publication WO2020186234 (which publication forms part of the present specification by its earlier incorporation-by-reference). Again, the module includes LEDs of different colors, and at least some of the LEDs are arranged in plural sets of plural LEDs each. ("Set" is used here in the sense of an orderly arrangement. The sets are depicted in FIG. 7 as positioned alone straight lines, but this is not required.)

Three different colors are used in the module of FIG. 7 (i.e., red, shown by light grey; blue, shown by mid grey; and infrared, shown by black), although other embodiments can employ two different colors, or four or more. Twelve different sets are shown, denoted as A1, A2, B1 . . . F2. The sets are paired into couplets, denoted as A, B, . . . F. The paired sets of each couplet have different LED counts (i.e., 24 and 12 LEDs), and the LEDs are spatially arranged within each couplet to define triplet groupings (12 per couplet in the depicted module). To the right of each set is a distribution count of the LEDs (in red, blue, infrared order).

Each triplet grouping is adapted to receive a lens assembly to focus light output onto an imaged region of the belt. Desirably, the lens has an elliptical output, with light spread more in one dimension than in a perpendicular dimension. A suitable lens assembly is Carclo Technical Plastics (UK) part number 10510, which focuses the output from the above-referenced Cree LEDs into a beam having full width at half maximum beam-widths of 45 degrees by 16 degrees. The wide dimension is oriented along the width of the belt, while the narrow dimension is oriented along the length (travel direction) of the belt. The latter measurement is typically chosen based on the distance between the LED modules and the belt, and the extent of the imaged field of view along the belt length.

Figure 8:
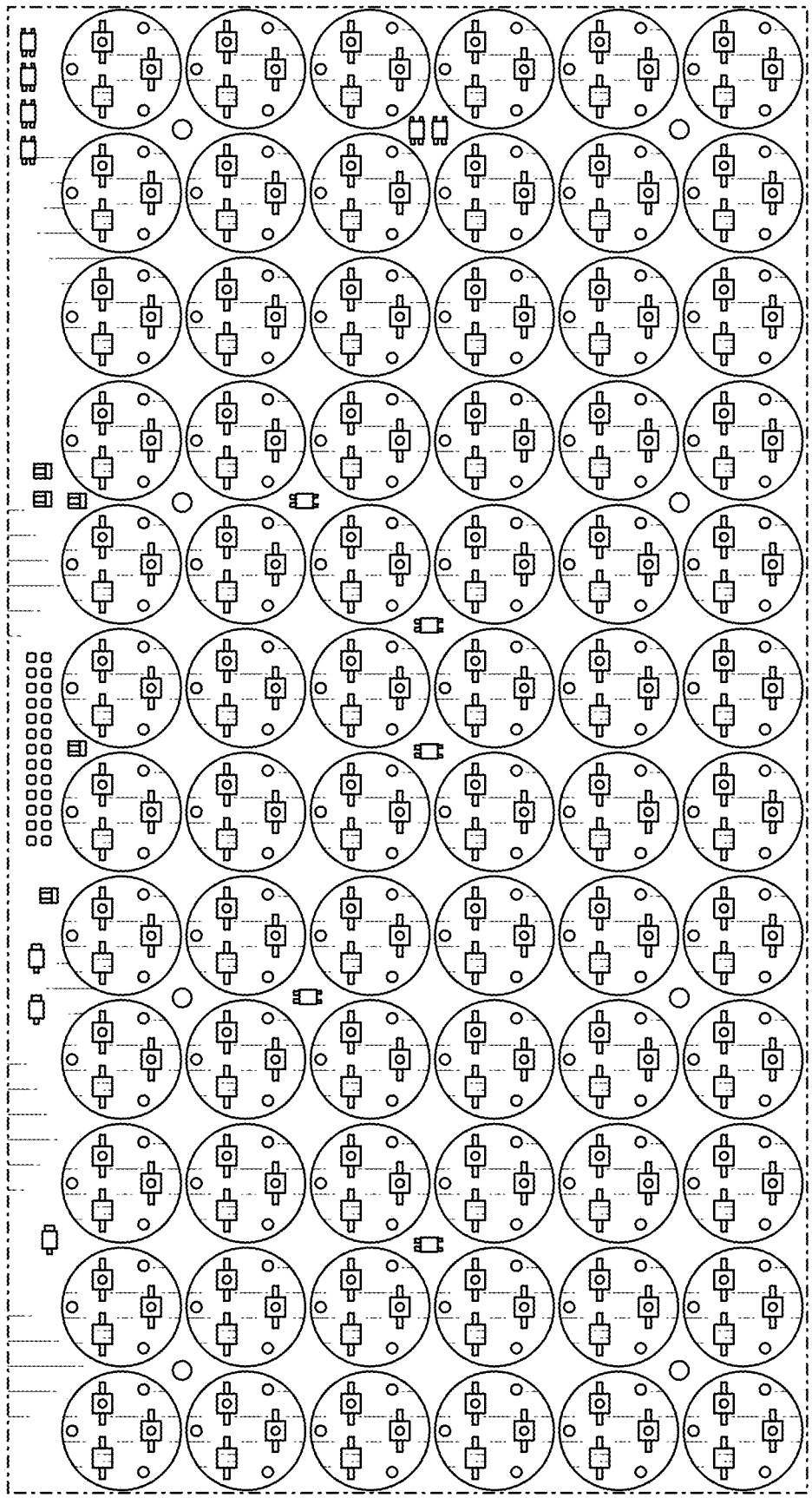
FIG. 8 shows a circuit board that can be used with the arrangement of FIG. 7.

FIG. 8 is an illustration of a circuit board that can be used with the arrangement of FIG. 7. The multi-layer circuit board measures 25×13.5 cm. Holes for a multi-pin connector that links to the associated power supply board are included at the top of the board.

The following paragraphs (and respective sub-paragraphs) review certain features by which an illumination module employing certain aspects of the present technology, comprising plural sets of plural LEDs each, may be characterized.

a. Some sets comprise LEDs of three or more different colors (e.g., set A1), and other individual sets comprise only one color (e.g., set A2) or two colors (e.g., set C1).
b. At least three sets have different respective counts of LEDs of a first color (e.g., set A1 has 3 infrared LEDs, while set A2 has 12 infrared LEDs, and set D1 has 4 infrared LEDs).
   i. At least two sets also have different respective counts of LEDs of a second color (e.g., set A1 has 12 blue LEDs, and set D1 has 8 blue LEDs).
      1. At least two sets also have different respective counts of LEDs of a third color (e.g., set A1 has 9 red LEDs, and set C1 has 12 red LEDs)
c. One set has a first count of LEDs of a common color (e.g., set A1 has 9 red LEDs); one set has a second count of LEDs of a common color (e.g., set A1 has 12 blue LEDs); one set has a third count of LEDs of a common color (e.g., set A1 has 3 infrared LEDs); one set had a fourth count of LEDs of a common color (e.g., set D1 has 8 blue LEDs); and one set has a fifth count of LEDs of a common color (e.g., set D1 has 4 infrared LEDs); wherein said five counts are all different.
d. One set has a first distribution count of plural colors (e.g., set A1 has a red/blue/infrared distribution of 9/12/3); a second set has a second distribution count of said plural colors (e.g., set C1 has a distribution of 12/12/0); a third set has a third distribution count of said plural colors (e.g., set D1 has a distribution of 12/8/4); and a fourth set has a fourth distribution count of said plural colors (e.g., set A2 has a distribution of 0/0/12), where plural of said distributions have less than two "0" counts, and said distributions are all different.
   i. At least three of said distribution counts have less than two "0" counts.
   ii. At least one of said distribution counts has no "0" count.
   iii. At least the first, second and third sets are each characterized by having equal total counts of LEDs (e.g., sets A1, C1 and D1 each have 24 total LEDs).
   iv. More than 25% of the sets in said module have said fourth distribution of plural colors (e.g., of the 12 sets, six each have the 0/0/12 distribution).
      1. More than 40% of the sets in said module have said fourth distribution of colors.
         a. Half of the sets in said module have said fourth distribution of colors.

v. More than 25% of the sets in said module have said first distribution of colors (e.g., of the 12 sets, four have the 9/12/3 distribution).
1. A third of the sets in said module have said first distribution of colors.
e. At least one pair of adjacent sets includes LEDs that are spatially arranged to define plural triplet groupings (e.g., the 12 triplet groupings of adjacent sets D1 and D2), where one or more of the groupings includes only two different colors (e.g., the triplet grouping at coordinate D1 in FIG. 7 includes only red and infrared LEDs), and one or more of the groupings comprises three different colors (e.g., the triplet grouping at coordinate D2 includes red, blue and infrared LEDs).
i. The two different colors are a subset of the three different colors.
ii. Between 5 and 50% of the triplet groupings comprise only two different colors (e.g., 16 of the 72 triplet groupings in FIG. 7 comprise only two different colors).
1. Or, more narrowly, between 10% and 33% of the triplet groupings comprise only two different colors.
a. Or, still more specifically, between 20% and 25% of the triplet groupings comprise only two different colors.
2. In some sets there are LEDs of three different colors (e.g., set A1 has LEDs of red, blue and infrared colors).
a. In some sets there are LEDs of only two different colors (e.g., set C1 has LEDs of only red and blue colors).
b. In some sets all LEDs are of a first color (e.g., in set A2 all LEDs are of the infrared color).
3. In some sets there are LEDs of only two different colors
a. In some sets all LEDs are of a first color.

It will be recognized that the arrangement of FIG. 7 is exemplary only. Many other arrangements (such as that of FIG. 1) fall within the scope of certain of these characterizing descriptions.

The LED driving arrangements and thermal sinking of the FIG. 1 module can be similarly employed in the FIG. 7 module.

The tighter LED packing of FIG. 1 is often preferred, as it provides more illumination per module area (typically 50%+ more). But the FIG. 7 arrangement costs less, and is well suited for somewhat less demanding applications.

It will be understood that the characterizing descriptions detailed above are not violated by the addition of other elements beyond those detailed. For example, the inclusion of singleton LEDs at three or four corners of the module circuit board (e.g., for calibration purposes) does not lessen fulfillment of any of the noted characterizing paragraphs.

Figure 9:
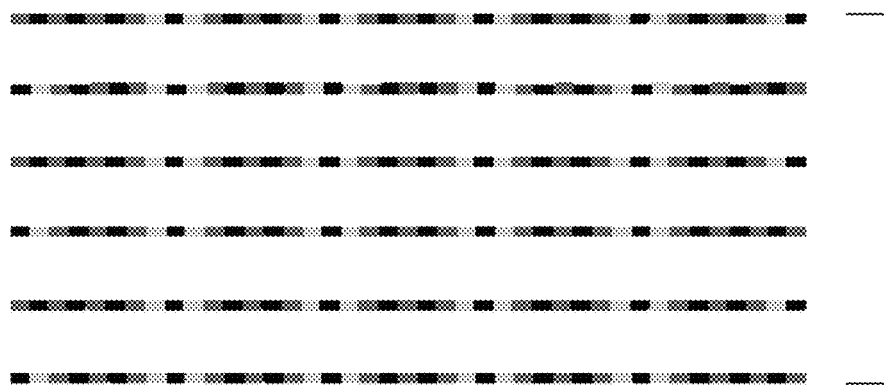
FIG. 9 shows an arrangement of LEDs in a different exemplary embodiment.
Figure 10A:
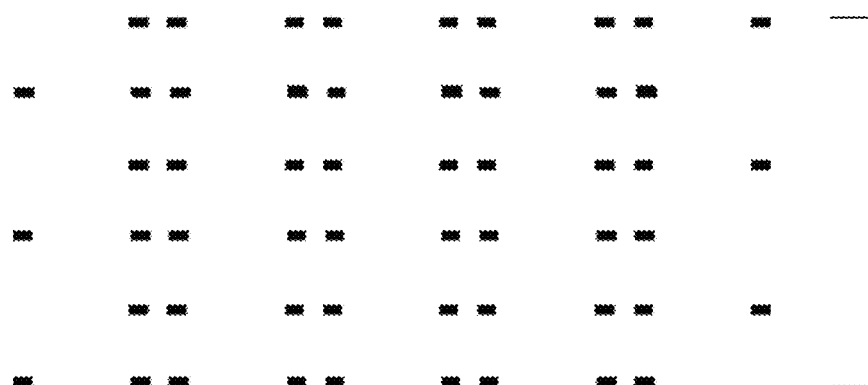
FIGS. 10A, 10B and 10C show placement of red, blue and infrared LEDs, respectively, in the embodiment of FIG. 9.
Figure 10B:
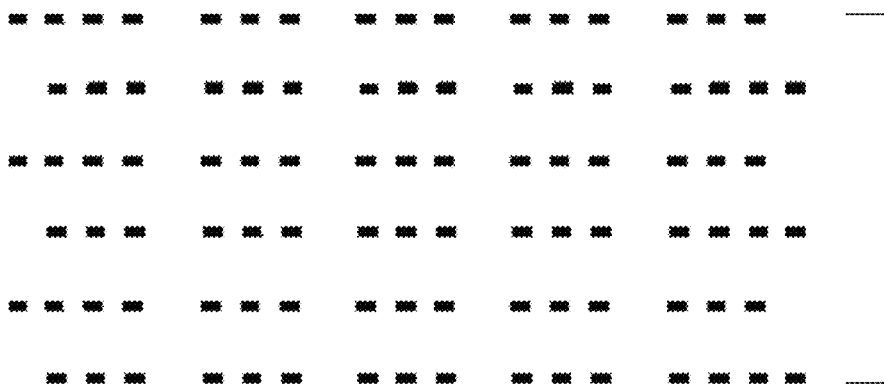
Figure 10C:
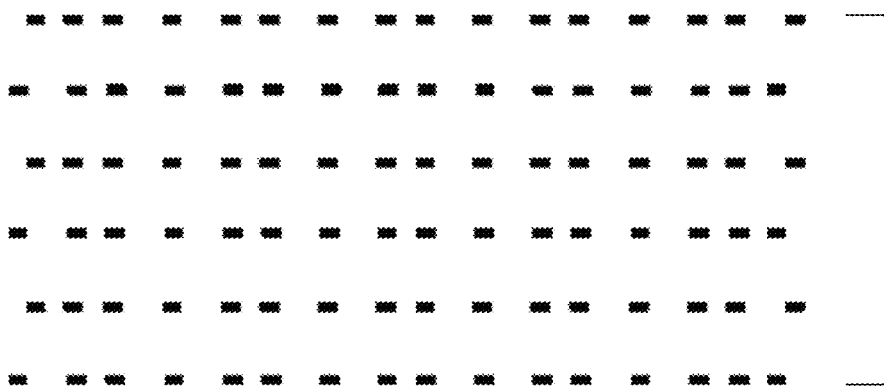

FIG. 9 shows yet another modular arrangement of LEDs of three colors (with light grey again indicating red, mid grey indicating blue, and black indicating infrared). FIGS. 10A, 10B and 10C break out the red, blue and infrared LED positions individually.

In this embodiment there are 54 red LEDs. Each row has nine.

There are 96 blue LEDs. Each row has 16.

There are also 96 infrared LEDs. Again, each row has 16.

The rows in this embodiment alternate; rows 1, 3 and 5 are identical (numbered from the top), and rows 2, 4 and 6 are identical.

It will be seen that while the blue and infrared LEDs are distributed approximately uniformly, the red LEDs are not. Although the red LEDs comprise about 22% of the total, there are multiple locations in the layout in which five neighboring LEDs (neighboring horizontally or vertically) can be identified that include no red LED.

Figure 11:
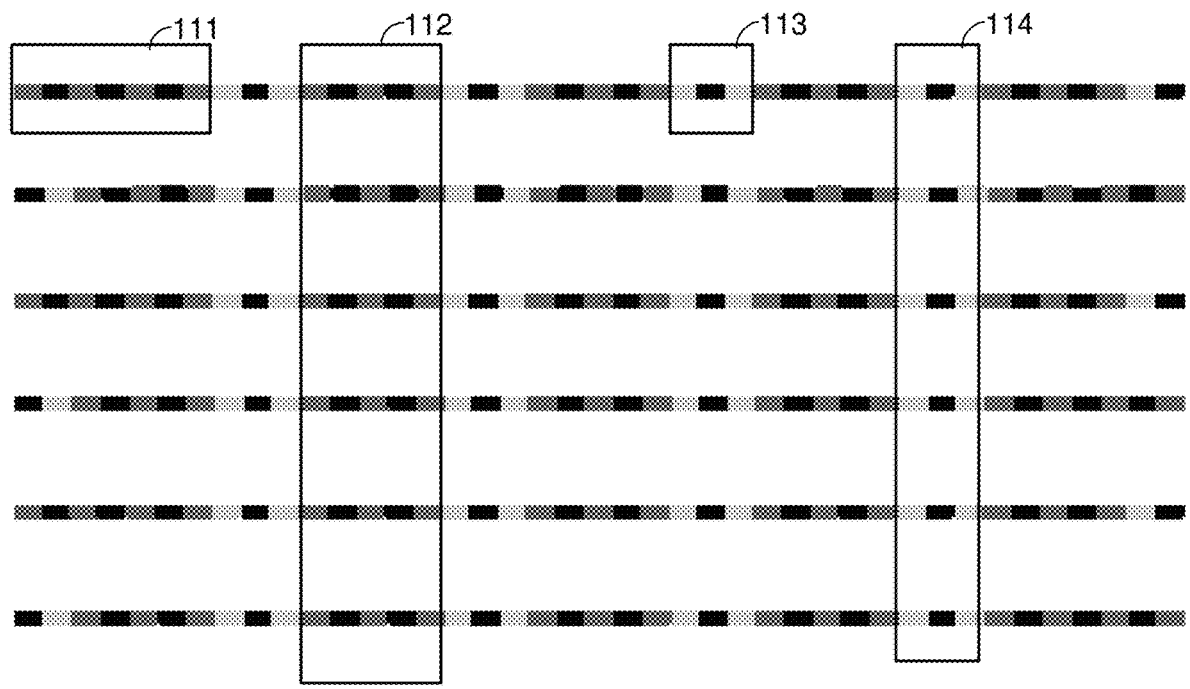
FIG. 11 is an enlargement of FIG. 9, with certain aspects identified.

For example, referring to FIG. 11, rectangle 111 defines a group of seven neighboring LEDs without a red LED. Rectangle 112 defines a group of 30 neighboring LEDs without a red. Etc. Yet, in other regions, red LEDs are over-represented. For example, rectangle 113 defines a group of three neighboring LEDs that includes two red LEDs. And rectangle 114 defines a group of 18 LEDs that includes 12 red LEDs.

Thus, one aspect of this embodiment is that LEDs of a particular color represent K percent of the total LED count, but comprise more than 2*K percent of the count in some neighboring rectangular regions of 10 LEDs. Another aspect is that they comprise less than 0.5*K percent of the count in other such regions. In this particular example, one or both of these aspects holds true for neighboring regions larger than 10 LEDs, e.g., 12, 15, 18 and 30 LEDs.

CONCLUDING REMARKS

It bears repeating that this patent specification builds on work detailed in the earlier-referenced documents, and should be read as if those disclosures are bodily included here. (Their omission vastly shortens the above text, and the drawings, correspondingly, in compliance with the statutory mandate that patent applications be "concise.") Applicant intends, and hereby expressly teaches, that the improvements detailed herein are to be applied in the context of the methods and arrangements detailed in the just-noted documents, and that such combinations form part of the teachings of the present disclosure.

Having described and illustrated aspects of our work with reference to particular examples, it should be understood that the technology is not so limited.

For example, while the detailed modules comprise six and twelve linear spatial groupings of LEDs, this is not required. A greater or smaller number of groupings, and groupings of different configurations, can be employed.

FIG. 2A shows that each electrical grouping comprises LEDs from three of the spatial groupings. This is not necessary. An electrical grouping can comprise LEDs from any number of spatial groupings.

While applicant often uses different numbers of blue, red and infrared LEDs in a module, this is not always the case. Some embodiments can employ identical numbers of LEDs of two or more colors (e.g., as shown in FIG. 9).

Similarly, the use of three LED colors is not required. A single color, two colors, or more than three colors can be employed, while still employing other aspects of the present technology.

Still further, the use of blue, red and infrared is not required. Other colors can be used. Some embodiments include ultraviolet LEDs, which can serve to excite fluorescent markers that are included in ink printed on items, or included in plastic resins from which items are formed, and emit light in one or more visible wavelength bands. Such markers can comprise Stokes compounds. Infrared LEDs can similarly stimulate a visible light fluorescence responses through use of anti-Stokes compounds.

Fluorescence can be advantageous because such item marking is imperceptible to humans. For example, a Stokes or anti-Stokes compound can be mixed with an ink or varnish and applied to a label or container. In some embodiments, such ink or varnish is applied in the pattern of a 2D machine-readable code, such as a QR code or a digital watermark block. When excited with UV or IR illumination, the fluorescent pattern can be detected and serve, e.g., to identify the item so that it can be sorted accordingly.

Exemplary fluorescing compounds include yttrium oxysulfide doped with gadolinium oxysulfide, and ytterbium (Yb3+)-doped oxide crystals combined either with erbium Er3+, holmium Ho3+ or thulium Tm3+ activator ions.

(Additional information about use of fluorescent materials in item identification is found in patent publications WO18193261 and US2020378894, and in Woidasky, et al, "Inorganic fluorescent marker materials for identification of post-consumer plastic packaging," Resources, Conservation and Recycling. 2020 Oct. 1; 161:104976.)

The LEDs of different colors can naturally include so-called white LEDs.

Although FIG. 3 shows the light bar to one side of the cameras, it will be recognized that this is not essential. For example, in one alternative arrangement, the light bar is directly over the viewing zone, and holes are provided in the circuit boards 10 through which camera lenses view out through the light bar to the viewing zone below. In another alternative arrangement, two light bars are employed—one on each side of the cameras. The two light bars may be operated in unison, or they may alternate with successive frame captures, or with every triple of frame captures (i.e., with each light bar cycling through three colors before the other bar begins a similar cycle).

In a further embodiment, one or more elliptical light shaping diffusor sheets are employed. These sheets scatter LED or laser illumination, incident on one side, to produce a shaped pattern exiting the other side. Different output patterns are available, such as with a spread of between 1 to 60 degrees in one dimension, and a spread of between 10 and 80 degrees in the perpendicular dimension. The longer dimension (which in a particular embodiment may be 40-60 degrees) is typically oriented to illuminate across the width dimension of the belt.

By using such a diffusor over circuit board modules of LEDs, the LEDs may be spaced still more densely because the separate lens assemblies may be omitted. (Exemplary LEDs are less than 4 mils on a side, permitting up to 25 to be mounted in a 2×2 cm area.) Denser placement allows brighter illumination, and enables use of a greater diversity of LED colors than is described above. Still brighter illumination may be achieved by selection of narrower dispersion patterns. For example, a 45×8 degree dispersion pattern generally provides doubles the light intensity of a 45×16 degree dispersion pattern—all other things being equal. Increased illumination permits shorter exposure intervals and/or smaller lens apertures, leading to reduction of motion blur and/or increase in depth of field. (Moreover, such diffusors typically have efficiencies of over 90%, as contrasted with efficiencies of below 90% for plastic LED lenses.)

Luminit LLC, of Torrance, CA, and Bright View Technologies Corporation, of Durham, NC, are suppliers of suitable diffusor sheets.

While LED illumination is detailed, it is noted that some lighting applications are transitioning to laser diodes (e.g., automotive headlamps). Laser diodes are similarly useful in embodiments of the present technology (e.g., with diffusor sheets or lenses), because they offer increased light output relative to LEDs, with consequent improvements in exposure intervals, depth of field, etc. Other light sources, present and upcoming, can likewise be substituted.

Specular reflection from smooth plastic surfaces can be a hindrance. Sometimes, however, it can be a help—depending on circumstance. (Imaging black plastic is one circumstance in which it can be a help. Another is where marking effects a roughening of a plastic surface, so that markings are distinguished in captured imagery by localized absences of specular reflection.) One advantageous arrangement employs plural separately-operable light sources that are positioned—relative to the camera—in manners configured so that one (or more) is adapted to lead to specular reflection in captured imagery, while one (or more) is adapted to avoid specular reflection in captured imagery.

Typically each lighting module, and a composite lighting bar formed from plural modules, has an apparent width of at least 5 cm.

The illumination system can be pulsed and cycled through different light configurations, such as: (a) capturing alternate image frames with infrared, then blue; (b) capturing alternate image frames with the first frame illuminated with infrared plus blue, and the next frame illuminated with red; or (c) capturing sequences of three frames: red, infrared, blue. Each image can be tagged with metadata indicating the color illumination with which it was captured.

In another example, a first frame can be captured with red light and a short exposure, followed by a second frame captured with blue light and a short exposure, followed by a third frame captured with red light and a long exposure, followed by a fourth frame captured with blue light and a long exposure, and then this cycle repeats. One of these frame captures starts every two milliseconds. (Long and short exposures are relative to each other and can be, e.g., 75 and 25 microseconds.) Each captured frame can be tagged with metadata indicating the illumination color and exposure interval, permitting the watermark detector to apply parameters optimized to each circumstance.

The spatial relationship of the components is desirably such that the illumination angle relative to the plane of the belt, at the center of the camera field of view, is 40 degrees or higher. Some embodiments have illumination angles of 75 or 80 degrees or more, i.e., approaching straight-down. If the camera has a straight-down orientation, the illumination source in this latter case is 15 or 10 degrees (or less) angularly displaced from the camera lens, as viewed from the center of the camera's field of view, and a mid-depth of field location.) Low angles are typically avoided, e.g., because they diminish the surface illumination by a $(1-\cos\theta)$ factor, requiring longer exposures.

(The angle of the light sources with respect to the camera optical axis is relevant as specular reflections from shiny objects often result in saturation of sensor pixels. The likelihood of seeing direct reflection of a light source in the field of view is a tradeoff, as specular reflections are desired for detection of watermark signals embossed in plastics, but are not desired for reading printed watermarks from shiny surfaces. A balance can be achieved by assessing location of reflection points when a mirror is placed on belt. Reflection points may be placed on the far top and bottom limits of the camera field of view.)

Although the detailed description is in the context of providing illumination for watermark reading, it should be understood that the described arrangements are useful in other scenarios. One is in multi-spectral imaging of items, e.g., for item identification. Another is in neural network-based item identification. In some embodiments, a convolutional neural network is trained (e.g., as detailed in U.S.

Pat. No. 10,664,722 and patent application 61/861,931) to distinguish items, in part, based on their differing appearances under two or more different colors of illumination. (For example, color ink on label artwork appears different under different colors of illumination.)

While an exemplary system is described as employing 22 current regulators, in other embodiments a lesser number can be used. For example, an embodiment can employ just eight regulators. At one frame interval the regulators are switched to apply current to the eight blue LED strings. At the next frame interval six of the regulators are switched to apply current to the six red LED strings. And at the next frame interval, the eight regulators are switched to apply current to the eight infrared strings.

Although the emphasis of the specification has been on illuminating items for recycling, it should be appreciated that the same technology can be used to sort plastic, glass and other containers for re-use. For example, a drink producer may serialize its bottles by texturing—each with a unique identifier code. When a customer returns a bottle for re-use, the processing line that washes and re-fills the bottle can also sense the serialization identifier, and increment a counter that tracks the number of times the bottle has been processed for re-use. When the bottle reaches an empirically-determined end of life (e.g., after 30 uses), it can be diverted for recycling. See, e.g., patent documents 20180349864 and EP0255861.

It will be recognized that systems employing aspects of the present technology do not require a conveyor belt per se. For examples, items can be transported past the camera(s) and to diverter systems otherwise, such as by rollers or by free-fall. All such alternatives are intended to be included by the terms "conveyor belt," "conveyor" or "belt."

Naturally, larger image sensors are preferable because they are more sensitive, which permits shorter exposures. Desirably each sensor has pixels larger than 3.5 micrometers on a side, and preferably larger than 5 micrometers on a side. Ideally, sensors with pixels of 10 or 15 micrometer size would be used, although costs are a factor. (An example is the SOPHIA 2048B-152 from Princeton Instruments—a 2K×2K sensor, with a pixel size of 15 micrometers.) An alternative is to use "binning" with a higher resolution sensor, e.g., a 2.5K×2.5K sensor with 5 micrometer pixels, in which adjoining 2×2 sets of pixels are binned together to yield performance akin to that of a 1.25K×1.25K sensor with 10 micrometer pixels. Suitable candidates include the Sony IMX420 sensor (with 9 micrometer effective pixel size after binning, and with a 10-bit analog-to-digital converter) and the Sony IMX425 sensor (again with 9 micrometer effective pixel size, but with a 12-bit ADC).

The lenses used with the cameras should minimize barrel distortion and chromatic aberration (e.g., with consistent focus at both 450 and 730 nanometers). Lenses in the Fujinon CF-ZA-1S series are satisfactory. Each lens should be focused at half of the required depth of field, e.g., 5 cm above the surface of the belt.

Artisans will understand that the capture and distribution of imagery at the high frame rates contemplated above is best performed by frame grabbers and other interface hardware adapted to such tasks. Exemplary embodiments may include, e.g., the Kaya Predator frame grabber, and the Mellanox Connect X5 Ethernet card. Such details are within the skill of the artisan so are not belabored here.

Similarly, while digital watermarks are a preferred type of item code, it will be recognized that any other machine-readable marking can be used, such as DotCode and dot peen markings (although certain benefits, such as readability from different viewpoints and robustness, may be impaired). U.S. Pat. No. 8,727,220 teaches twenty different 2D codes that can be embossed or molded into an outer surface of a plastic container. If desired, an item may be marked with multiple instances of a watermark or other 2D code block, with random noise interspersed between the blocks (e.g., as in U.S. publication 20110240739).

In an exemplary embodiment, watermark detection and synchronization employs a direct least squares and phase deviation approach, e.g., as detailed in our U.S. Pat. Nos. 9,959,587 and 10,242,434. Other techniques, however, can also be used. One example is a coiled all-pose arrangement, as detailed in patent publication 20190266749. Another option is to use an impulse matched filter approach, (e.g., correlating with a template comprised of peaks), as taught in U.S. patent documents 10,242,434 and 6,590,996.

In addition to the references cited above, details concerning watermark encoding and reading that can be included in implementations of the present technology are disclosed in applicant's previous patent filings, including U.S. Pat. Nos. 5,850,481, 6,122,403, 6,590,996, 6,614,914, 6,782,115, 6,947,571, 6,975,744, 6,985,600, 7,044,395, 7,065,228, 7,123,740, 7,130,087, 7,403,633, 7,763,179, 8,224,018, 8,300,274, 8,412,577, 8,477,990, 8,543,823, 9,033,238, 9,349,153, 9,367,770, 9,521,291, 9,600,754, 9,749,607, 9,754,341, 9,864,919, 10,113,910, 10,217,182, 10,958,807, 20160364623, 20190332840, 20190378235, and 20200311505, and in U.S. application Ser. No. 16/823,135, filed Mar. 18, 2020.

It will be understood that the computing methods and algorithms performed in embodiments of the present technology above can be executed using computer devices employing one or more processors, one or more memories (e.g. RAM), storage (e.g., a disk or flash memory), a user interface (which may include, e.g., a keypad, a TFT LCD or OLED display screen, touch or other gesture sensors, together with software instructions for providing a graphical user interface), interconnections between these elements (e.g., buses), and a wired or wireless interface for communicating with other devices.

Such methods and algorithms can be implemented in a variety of different hardware processors, including a microprocessor, an ASIC (Application Specific Integrated Circuit) and an FPGA (Field Programmable Gate Array), as detailed in the cited references (e.g., publication PCT/US20/22801).

Software instructions for implementing the detailed functionality using such hardware processors can be authored by artisans without undue experimentation from the descriptions provided herein, e.g., written in C, C++, Visual Basic, Java, Python, Tcl, Perl, Scheme, Ruby, Caffe, TensorFlow, etc., in conjunction with associated data.

Software and hardware configuration data/instructions are commonly stored as instructions in one or more data structures conveyed by tangible media, such as magnetic or optical discs, memory cards, ROM, etc., which may be accessed across a network. Some embodiments may be implemented as embedded systems—special purpose computer systems in which operating system software and application software are indistinguishable to the user (e.g., as is commonly the case in basic cell phones). The functionality detailed in this specification can be implemented in operating system software, application software and/or as embedded system software.

Different of the functionality can be implemented on different devices. Different tasks can be performed exclusively by one device or another, or execution can be distributed between devices. In like fashion, description of data being stored on a particular device is also exemplary; data can be stored anywhere: local device, remote device, in the cloud, distributed, etc.

Other recycling arrangements are taught in US patent documents 4644151, 5965858, 6390368, 20060070928, 20140305851, 20140365381, 20170225199, 20180056336, 20180065155, 20180349864, and 20190030571. Alternate embodiments of the present technology employ features and arrangements from these cited documents.

This specification has discussed various embodiments. It should be understood that the methods, elements and concepts detailed in connection with one embodiment can be combined with the methods, elements and concepts detailed in connection with other embodiments. While some such arrangements have been particularly described, many have not—due to the number of permutations and combinations. Applicant similarly recognizes and intends that the methods, elements and concepts of this specification can be combined, substituted and interchanged—not just among and between themselves, but also with those known from the cited prior art. Moreover, it will be recognized that the detailed technology can be included with other technologies—current and upcoming—to advantageous effect. Implementation of such combinations is straightforward to the artisan from the teachings provided in this disclosure.

While this disclosure has detailed particular ordering of acts and particular combinations of elements, it will be recognized that other contemplated methods may re-order acts (possibly omitting some and adding others), and other contemplated combinations may omit some elements and add others, etc.

Although disclosed as complete systems, sub-combinations of the detailed arrangements are also separately contemplated (e.g., omitting various of the features of a complete system).

While certain aspects of the technology have been described by reference to illustrative methods, it will be recognized that apparatuses configured to perform the acts of such methods are also contemplated as part of applicant's inventive work. Likewise, other aspects have been described by reference to illustrative apparatus, and the methodology performed by such apparatus is likewise within the scope of the present technology. Still further, tangible computer readable media containing instructions for configuring a processor or other programmable system to perform such methods is also expressly contemplated.

To provide a comprehensive disclosure, while complying with the Patent Act's requirement of conciseness, applicant incorporates-by-reference each of the documents referenced herein. (Such materials are incorporated in their entireties, even if cited above in connection with specific of their teachings.) These references disclose technologies and teachings that applicant intends be incorporated into the arrangements detailed herein, and into which the technologies and teachings presently-detailed be incorporated.

In view of the wide variety of embodiments to which the principles and features discussed above can be applied, it should be apparent that the detailed embodiments are illustrative only, and should not be taken as limiting the scope of the technology.

The invention claimed is:

1. Apparatus for illuminating items on a conveyor belt for identification, comprising a lighting bar including plural lighting modules, each of said plural lighting modules having a length and breadth, said plural lighting modules being arrayed lengthwise end-to-end in sufficient number that the end-to-end array of said plural lighting modules spans the conveyor belt, in which each of said plural lighting module comprises LEDs of three or more different colors, and said apparatus includes one or more controllers adapted to operate said plural lighting modules in unison to issue separate flashes of at least first, second and third different light spectra, at least one of said flashes having a duration of 100 microseconds or less, and in which, in a first of said plural lighting modules, the LEDs are arranged in groupings, and the LEDs of said three or more different colors are not arranged exclusively in groupings of common color, but rather include at least one grouping comprising LEDs of plural colors, in which LEDs of a first of said plural lighting modules are disposed in a planar array, characterized in that K percent of said LEDs are of a first color, where K is a positive integer, yet in a first region within said planar array that is defined by a first rectangular border and that includes 10 or more of said LEDs, there are more than 2*K percent of LEDs of the first color.

2. Apparatus for illuminating items on a conveyor belt for identification, comprising a lighting bar including plural lighting modules, each of said plural lighting modules having a length and breadth, said plural lighting modules being arrayed lengthwise end-to-end in sufficient number that the end-to-end array of said plural lighting modules spans the conveyor belt, each of said plural lighting modules comprising LEDs of two or more different colors, said apparatus including one or more controllers adapted to operate said plural lighting modules in unison to issue separate flashes of at least first and second different light spectra, at least one of said flashes having a duration of 100 microseconds or less, in which a first of said plural lighting modules includes a circuit board on which LEDs of that module are mounted, wherein each of said LEDs is thermally coupled, by plural metallic vias that extend through the circuit board, to a shared copper ground plane for thermal dissipation, rather than each of said LEDs having an isolated copper plane for thermal dissipation.

3. The apparatus of claim 2 in which the LEDs of a first of said plural lighting modules are disposed in a planar array, characterized in that K percent of said LEDs are of a first color, where K is a positive integer, yet in a first region within said planar array that is defined by a first rectangular border and that includes 10 or more of said LEDs, there are more than 2*K percent of LEDs of the first color.

4. The apparatus of claim 2 in which the LEDs of a first of said plural lighting modules are disposed in a planar array, characterized in that K percent of said LEDs are of a first color, where K is a positive integer, yet in a first region within said planar array that is defined by a first rectangular border and that includes 10 or more of said LEDs, there are less than 0.5*K percent of LEDs of the first color.

5. Apparatus for illuminating items on a conveyor belt for identification, comprising a lighting bar including plural lighting modules, each of said plural lighting modules having a length and breadth, said plural lighting modules being arrayed lengthwise end-to-end in sufficient number that the end-to-end array of said plural lighting modules spans the conveyor belt, in which each of said plural lighting module comprises LEDs of three or more different colors, and said apparatus includes one or more controllers adapted to operate said plural lighting modules in unison to issue separate flashes of at least first, second and third different light spectra, at least one of said flashes having a duration of 100 microseconds or less, that further includes a power source operative to switch a driving signal between first and second voltages for respectively energizing and de-energizing a group of said LEDs to produce a flash of light, characterized in that the second voltage is more than 20% of the first voltage, thereby limiting magnitude of a switching transient that accompanies said energizing and de-energizing of the group of LEDs, said limited switching transient thereby limiting electrical noise emitted by said apparatus.

6. Apparatus for illuminating items on a conveyor belt for identification, comprising a lighting bar including plural lighting modules, each of said plural lighting modules having a length and breadth, said plural lighting modules being arrayed lengthwise end-to-end in sufficient number that the end-to-end array of said plural lighting modules spans the conveyor belt, in which each of said plural lighting module comprises LEDs of three or more different colors, and said apparatus includes one or more controllers adapted to operate said plural lighting modules in unison to issue separate flashes of at least first, second and third different light spectra, at least one of said flashes having a duration of 100 microseconds or less, in which a first of said plural lighting modules includes LEDs arranged on a circuit board in electronic and spatial groupings, each electronic grouping defining a collection of LEDs adapted to be controlled in common—illuminating in synchrony, each spatial grouping comprising light sources within a rectangular boundary of at least three different colors, a first of said spatial groupings comprising a count of X1 light sources of a first color, Y1 light sources of a second color, and Z1 light sources of a third color, a second of said spatial groupings comprising a count of X2 light sources of the first color, Y2 light sources of the second color, and Z2 light sources of the third color, wherein said electronic groupings are different from said spatial groupings.

7. The apparatus of claim 6 wherein X1 and X2 are different.

8. The apparatus of claim 7 wherein Y1 and Y2 are different, and Z1 and Z2 are different.

9. The apparatus of claim 6 in which a first of said electronic groupings comprises M light sources in the first spatial grouping and N light sources in the second spatial grouping, where M and N are different.

10. The apparatus of claim 1 wherein a first of said different colors is blue with a peak wavelength between 440 and 495 nm, a second of said different colors is red with a peak wavelength of between 620 and 699 nm, and a third of said different colors is infrared with a peak wavelength of between 700 and 790 nm.

* * * * *